(12) United States Patent
Tai et al.

(10) Patent No.: US 8,338,856 B2
(45) Date of Patent: *Dec. 25, 2012

(54) BACKSIDE ILLUMINATED IMAGE SENSOR WITH STRESSED FILM

(75) Inventors: Hsin-Chih Tai, San Jose, CA (US); Howard E. Rhodes, San Martin, CA (US); Wei Zheng, Los Gatos, CA (US); Vincent Venezia, Los Gatos, CA (US); Yin Qian, Milpitas, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 58 days.

This patent is subject to a terminal disclaimer.

(21) Appl. No.: 12/853,803

(22) Filed: Aug. 10, 2010

(65) Prior Publication Data

US 2012/0038014 A1 Feb. 16, 2012

(51) Int. Cl.
*H01L 31/0328* (2006.01)
(52) U.S. Cl. .......... 257/184; 257/69; 257/257; 257/291; 257/E31.058
(58) Field of Classification Search .................... 257/69, 257/184, 257, 291
See application file for complete search history.

(56) References Cited

U.S. PATENT DOCUMENTS

| | | | |
|---|---|---|---|
| 4,760,031 A | 7/1988 | Janesick | |
| 5,688,715 A | 11/1997 | Sexton et al. | |
| 6,169,319 B1 | 1/2001 | Malinovich et al. | |
| 6,489,992 B2 | 12/2002 | Savoye | |
| 6,903,768 B1 | 6/2005 | Ohsawa et al. | |
| 6,960,796 B2 | 11/2005 | Rhodes et al. | |
| 7,005,637 B2 | 2/2006 | Costello et al. | |
| 7,247,829 B2 | 7/2007 | Oda | |
| 8,129,809 B2 | 3/2012 | Jang | |
| 2001/0052574 A1 | 12/2001 | Kurosawa et al. | |
| 2003/0146987 A1 | 8/2003 | Prentice et al. | |
| 2003/0173582 A1 | 9/2003 | Hatano et al. | |
| 2004/0051124 A1 | 3/2004 | Kawasaki | |
| 2004/0169248 A1 | 9/2004 | Costello et al. | |
| 2005/0243194 A1 | 11/2005 | Xu | |

(Continued)

FOREIGN PATENT DOCUMENTS

EP 1612863 A2 1/2006

(Continued)

OTHER PUBLICATIONS

Shi, L. C. et al., "Plasma-enhanced chemical vapor deposition of thick silicon nitride films with low stress on InP", J. Vac. Sci. Technol. A 14(2), Mar./Apr. 1996, pp. 471-473, American Vacuum Society.

(Continued)

*Primary Examiner* — Wai Sing Louie
(74) *Attorney, Agent, or Firm* — Blakely Sokoloff Taylor & Zafman LLP

(57) ABSTRACT

A backside illuminated ("BSI") complementary metal-oxide semiconductor ("CMOS") image sensor includes a photosensitive region disposed within a semiconductor layer and a stress adjusting layer. The photosensitive region is sensitive to light incident on a backside of the BSI CMOS image sensor to collect an image charge. The stress adjusting layer is disposed on a backside of the semiconductor layer to establish a stress characteristic that encourages photo-generated charge carriers to migrate towards the photosensitive region.

15 Claims, 12 Drawing Sheets

U.S. PATENT DOCUMENTS

| | | |
|---|---|---|
| 2006/0076590 A1 | 4/2006 | Pain et al. |
| 2007/0001252 A1 | 1/2007 | Noda et al. |
| 2007/0259463 A1 | 11/2007 | Abedini |
| 2008/0001192 A1 | 1/2008 | Inoue et al. |
| 2008/0150057 A1 | 6/2008 | Lee et al. |
| 2008/0197268 A1 | 8/2008 | Kameda |
| 2008/0283726 A1* | 11/2008 | Uya et al. .................... 250/208.1 |
| 2009/0201393 A1 | 8/2009 | Tai et al. |
| 2010/0110271 A1 | 5/2010 | Yanagita et al. |
| 2010/0140675 A1 | 6/2010 | Rhodes |
| 2010/0214457 A1 | 8/2010 | Sakai |
| 2011/0199518 A1* | 8/2011 | Zheng et al. .................. 348/243 |
| 2011/0207250 A1 | 8/2011 | Uya |

FOREIGN PATENT DOCUMENTS

| | | |
|---|---|---|
| EP | 1058313 A2 | 12/2006 |
| EP | 1858082 | 11/2007 |
| JP | 3240379 A | 10/1991 |

OTHER PUBLICATIONS

MacKenzie, K.D. et al., "Inductively-Coupled Plasma Deposition of Low Temperature Silicon Dioxide and Silicon Nitride Films For III-V Applications", $195^{th}$ Electrochemical Society Meeting, May 1999, 12 pages.

Janesick, James et al., "Quantum Efficiency Model For The CCD Flash Gate", International Electronic Devices Meeting, 1986, 3 pages.

U.S. Appl. No. 12/708,330, filed Feb. 18, 2010.

Janesick, J. "Charge coupled CMOS and hybrid detector arrays," SPIE, San Diego, Focal Plane Arrays for Space Telescope, paper #5167-1, Aug. 2003.

* cited by examiner

Figure 4C  PHOTOLITHOGRAPHY PROCESS

US 8,338,856 B2

BACKSIDE ILLUMINATED IMAGE SENSOR WITH STRESSED FILM

TECHNICAL FIELD

This disclosure relates generally to image sensors, and in particular but not exclusively, relates to backside illuminated ("BSI") complementary metal-oxide-semiconductor ("CMOS") image sensors.

BACKGROUND INFORMATION

CMOS image sensors may generate inaccurate image data due to dark current in the pixels themselves and variation in the level of dark current from pixel to pixel. Dark currents add to the output voltages and degrade the picture provided by the imaging system. Therefore, to generate accurate image data, it is desirable to reduce or eliminate dark currents. For a BSI CMOS image sensor, dark currents may be a particular problem. A typical BSI CMOS image sensor has dark current levels that are over 100 times greater than that of a front side illuminated sensor. This may be caused by the fabrication process to produce the relatively thin substrate layer of the BSI CMOS image sensor.

The fabrication process for BSI CMOS image sensors produces a relatively thin (e.g., less than 4 micrometers) backside silicon layer with techniques such as chemical mechanical polishing ("CMP") and chemical etching. The resulting backside silicon surface may suffer from a high number of defects that may exacerbate dark currents by providing leakage paths, resulting in a relatively high number of hot pixels. This surface defect problem may be addressed by ion implantation of P or N type dopants into the backside surface. Backside dopant implantation produces fields that may facilitate the movement of photo generated electric carriers away from the backside surface. For example, for an N type photodiode, the photoelectric effect produces electrons as charge carriers. Therefore, a P type dopant may be implanted on the backside surface to generate a requisite field to reduce the contribution of the electron carriers from the backside surface into the phododiode. For a P type photodiode, the photoelectric effect produces holes as charge carriers. Therefore, an N type dopant may be implanted on the backside surface to generate the requisite field to reduce the contribution of the hole carriers from the backside surface into phododiode.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 4C is a cross sectional view of a partially fabricated backside illuminated image sensor showing a photo printing process that creates a pattern on the buffer film, in accordance with an embodiment.

DETAILED DESCRIPTION

Embodiments of a system and method of fabrication for a BSI imaging system with black reference pixels that more faithfully produce a black reference level for offsetting active imaging pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics of a given embodiment may be combined in any suitable manner with any of the other embodiments. It is anticipated that the features described below in connection with the various figures may be combined in a variety of different combinations.

Figure 1:
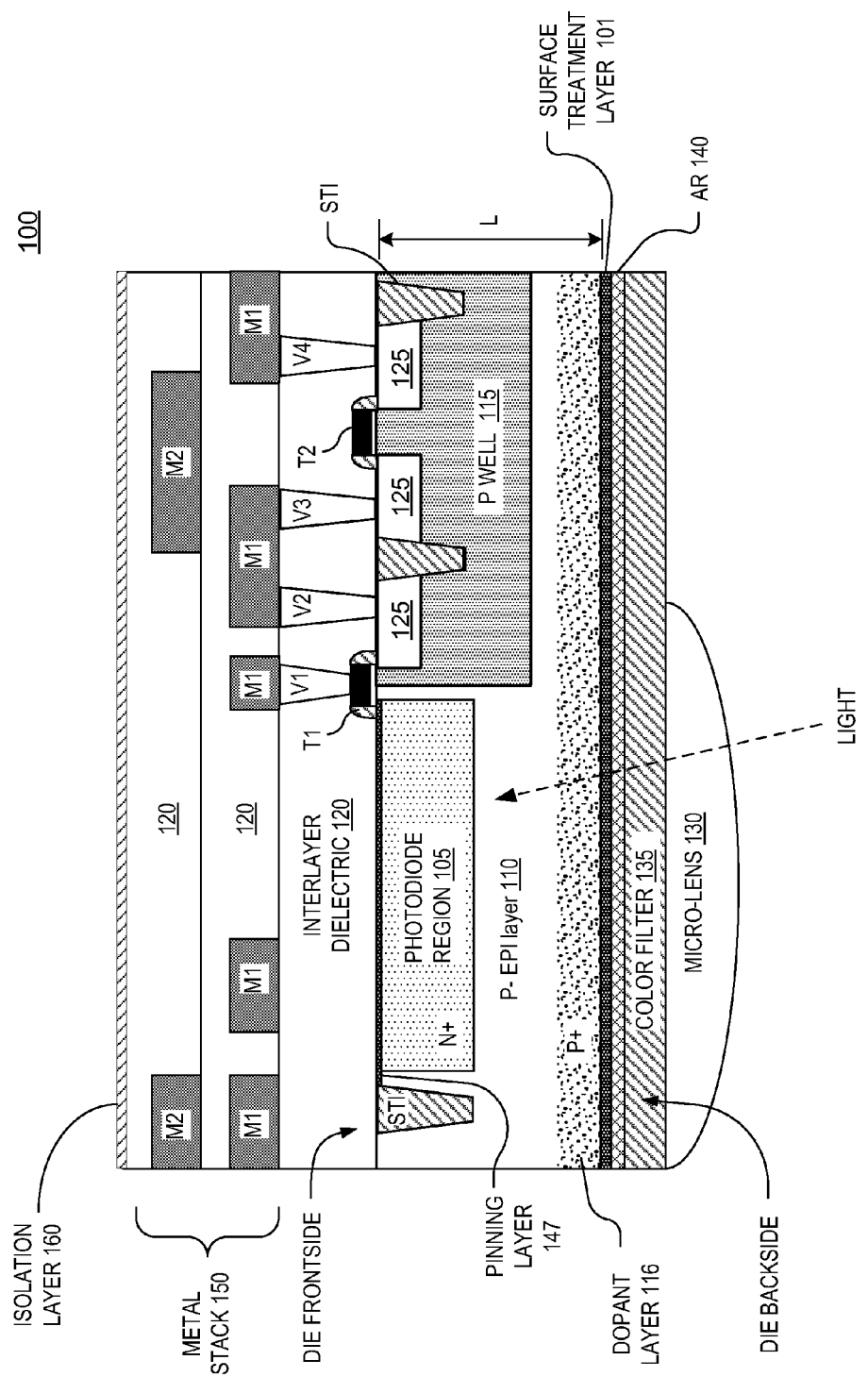
FIG. 1 is a cross sectional view of backside illuminated image sensor with dopant implantation to address defects of the backside surface.

FIG. 1 illustrates an example of a BSI image sensor pixel 100 including a photodiode ("PD") region 105 (more generically referred to as a photosensitive region) disposed within an epitaxial ("epi") layer 110. BSI image sensor 100 is photosensitive to light incident upon the backside of the sensor die. Pixel circuitry for operation of the BSI image sensor is formed over a P well 115. The illustrated example of pixel 100 also includes a surface treatment layer 101, a P+ dopant layer 116, N+ source/drain diffusions 125, pixel circuitry (only transfer transistor T1 and reset transistor T2 are illustrated), a microlens 130, a color filter layer 135, an antireflective ("AR") film 140, an inter-metal dielectric layer 120, a P+ passivation or pinning layer 147, and a metal stack 150. The metal stack 150 includes multiple metal layers (e.g., M1, M2, etc.) separated by inter-metal dielectrics 120, and interconnected with vias (e.g., V1, V2, V3, etc.). Pixel 100 includes one or more shallow trench isolations (STI), at some of which are used to separate pixel 100 from adjacent pixels in a pixel array (not illustrated). On top of the metal stack 150 is an isolation layer 160. The isolation layer 160 isolates the metal stack 150 from harmful environmental elements such as pollutants or moisture. The isolation layer 160 may be composed of materials such as silicon nitride.

The dopant layer 116 creates a sharp dopant gradient which provides a vertical force that pushes photo generated electrons vertically towards the collecting depletion region of the photodiode region 105. Additionally, the dopant layer 116 passivates the backside surface of the epi layer 110, thereby reducing the leakage current from the photodiode region 105. However, the relative thinness of the backside epi layer 110 causes problems during the fabrication process. First, it can be difficult to control the relatively shallow implant depth of the dopant layer 116. The lack of control of the implant depth may cause the implanted dopant to penetrate too deep into the epi layer 110 towards the photodiode region 105, thus harming the quantum efficiency of the device. Second, it can be difficult to keep the temperature in check when the dopant is annealed by a laser following the implantation step. A relatively high annealing temperature may overheat the epi layer 110, thereby damaging the front structures such as T1, T2, M1, M2, V1, V2 and V3.

A BSI image sensor's backside surface stress may affect its dark current level. The present application discloses utilizing structures and methods to adjust the stress on a CMOS image sensor's backside silicon surface, thereby reducing the dark current effect by facilitating the movement of photo generated charge carriers away from the backside surface.

Stress on a backside silicon surface may be adjusted by forming a stress loaded layer on the surface. A stress loaded layer may include materials such as metal, organic compounds, inorganic compounds, or otherwise. For example, the stress loaded layer may include a silicon oxide ($SiO_2$) film, a silicon nitride (SiNx) film, a silicon oxynitride (SiOxNy) film, or a combination thereof. In the CMOS manufacturing art, the abovementioned films may be formed by a process such as chemical vapor deposition ("CVD") or physical vapor deposition ("PVD"). A CVD process may include a plasma enhanced chemical vapor deposition (PECVD) process, a high density plasma-enhanced chemical vapor deposition (HDPCVD) process, etc.

Depending on factors such as gas pressure, temperature, film thickness, material composition and annealing, a film may possess a tensile stress or a compressive stress of various values, or may be stress neutral. In order to use PECVD or HDPCVD to form a film that achieves a desirable stress, a manufacturer may vary several process parameters such as the relative abundance of particular precursors, power level, plasma drive frequency, temperature, post-deposition processing, etc. For example, a $SiO_2$ film may be formed by a plasma deposition of precursors $SiH_4$ and $O_2$. Increasing the $O_2:SiH_4$ ratio decreases the film's compressive stress, whereas increasing the rf chuck power increases the film's compressive stress. In another example, a SiNx film may be formed by a plasma deposition of precursors $SiH_4$ and $N_2$. Increasing the $N_2:SiH_4$ ratio increases the film's compressive stress, whereas increasing the rf chuck power decreases the film's compressive stress. Yet in another example, a SiOxNy film may be formed by a plasma deposition of precursors $SiH_4$ and $N_2O$. Here, an increased $N_2O:SiH_4$ ratio generally increases the film's compressive stress. Yet in another example, as a SiNx film is formed by a PECVD process involving precursors $SiH_4$, $NH_3$ and $N_2$, a conventional 13.56 MHz frequency 17 W power tends to produce a tensile stress in the film, whereas adding a less than 1 MHz low frequency 400 W power component may result in high energy ion bombardment of the growing SiNx film, thereby changing the film's stress state from tensile to compressive. Yet in another example, periodically alternating high and low frequency power sources may produce a film that has a substantially low level of stress. Yet in another example, a ultra-violet assisted thermal processing step after the formation of a SiNx film may break Si—H and N—H bonds in the film, resulting in hydrogen removal, thereby increasing the film's stress.

By employing various film forming techniques such as PECVD and HDPCVD, and by controlling various process parameters such as precursor ratio, power level, and power frequency, one may form a film or films of desirable stress types and stress levels on a backside silicon surface. These stress adjustment films may influence the stress conditions of the backside surface and/or the front side surface, thereby affecting the behavior of photo generated charge carriers, resulting in a change of the dark current level.

Figure 2A:
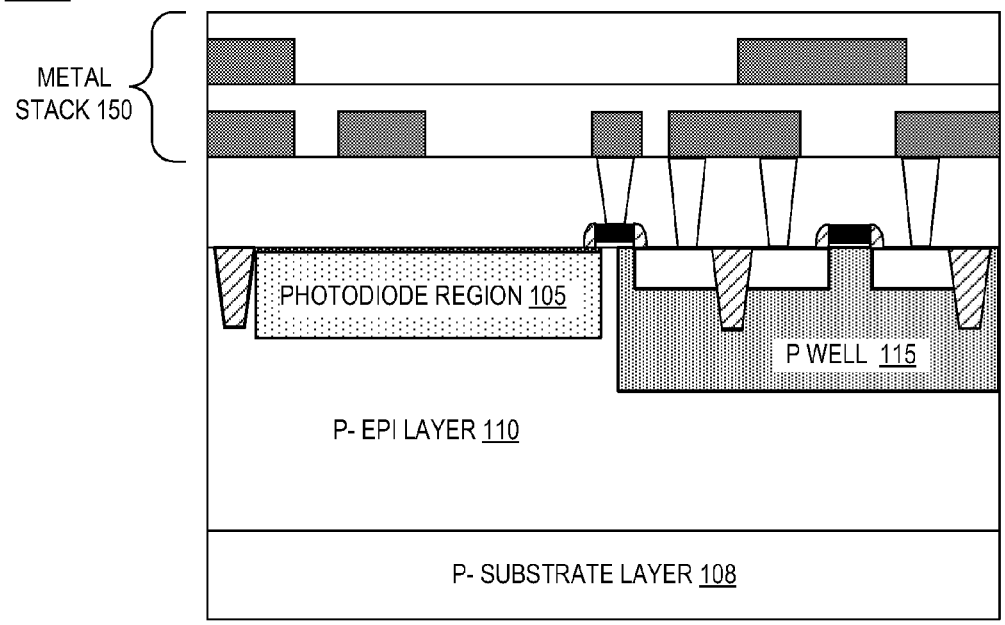
FIG. 2A is a cross sectional view of a partially fabricated backside illuminated image sensor before thinning of the epi layer, in accordance with an embodiment.
Figure 2B:
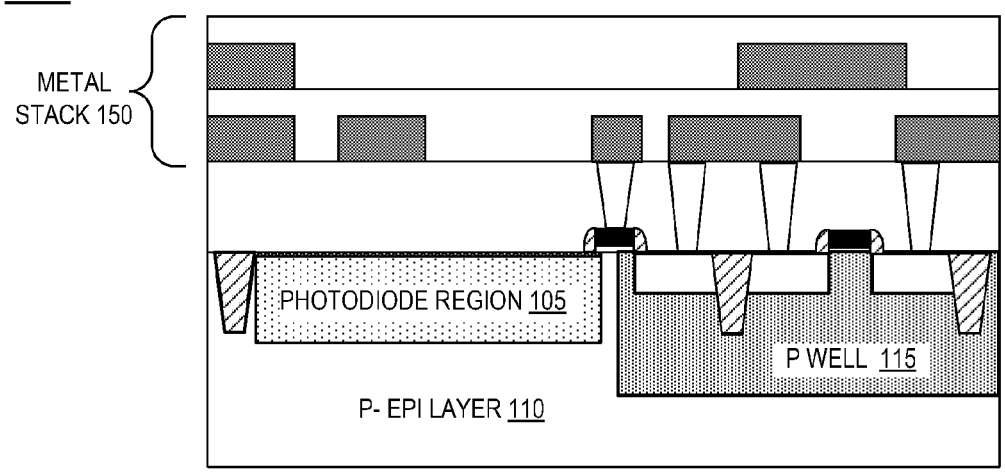
FIG. 2B is a cross sectional view of a partially fabricated backside illuminated image sensor after thinning of the epi layer, in accordance with an embodiment.

FIG. 2A shows a partially fabricated BSI CMOS image sensor pixel 200a including a photodiode region 105, a P well 115, a metal stack 150, and a relatively thick backside substrate layer 108 and epi layer 110. With the exception of the relatively thick backside substrate layer 108, pixel 200a has substantially the same back-end-of-the-line components (e.g. metal stack 150) as pixel 100 in FIG. 1. The backside substrate layer 108 may be removed and epi layer 110 substantially thinned to produce a relatively thin epi layer 110, thereby producing pixel 200b, as shown in FIG. 2B. The thinning may be achieved by a combination of chemical mechanical polishing, chemical etching, or otherwise. In one embodiment, the thinned epi layer 110 may have a thickness of less than 4 micrometer. In some embodiments, the thickness may be between 1.5 to 3 micrometers.

Figure 2C:
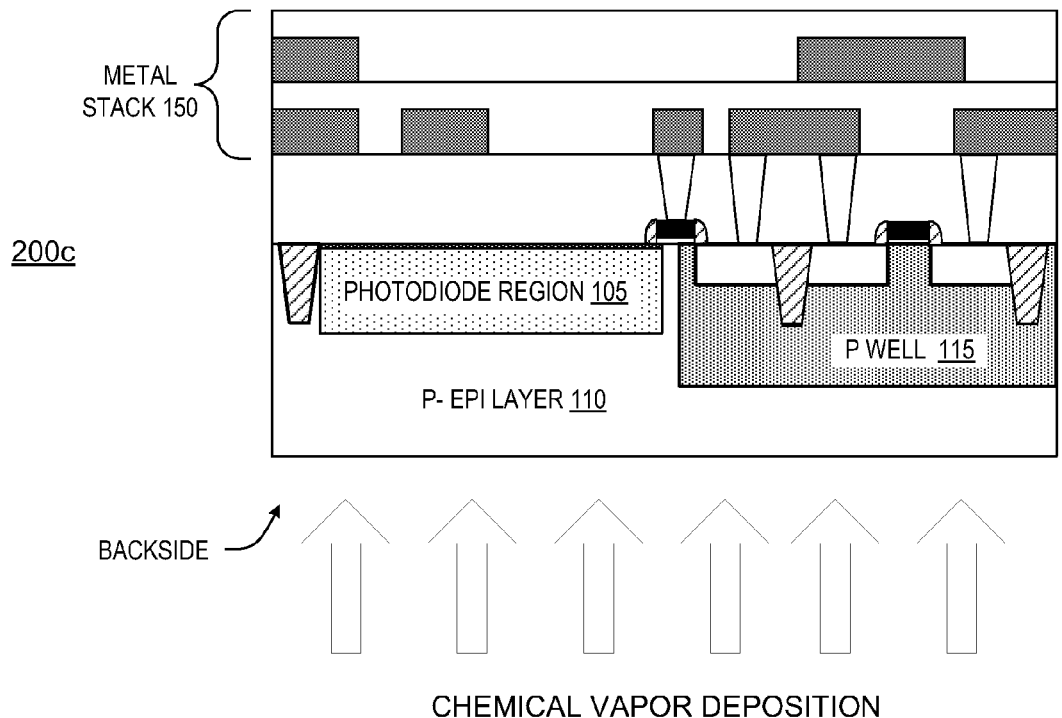
FIG. 2C is a cross sectional view of a partially fabricated backside illuminated image sensor showing the deposition of a stress film on the backside surface of the epi layer, in accordance with an embodiment.
Figure 2D:
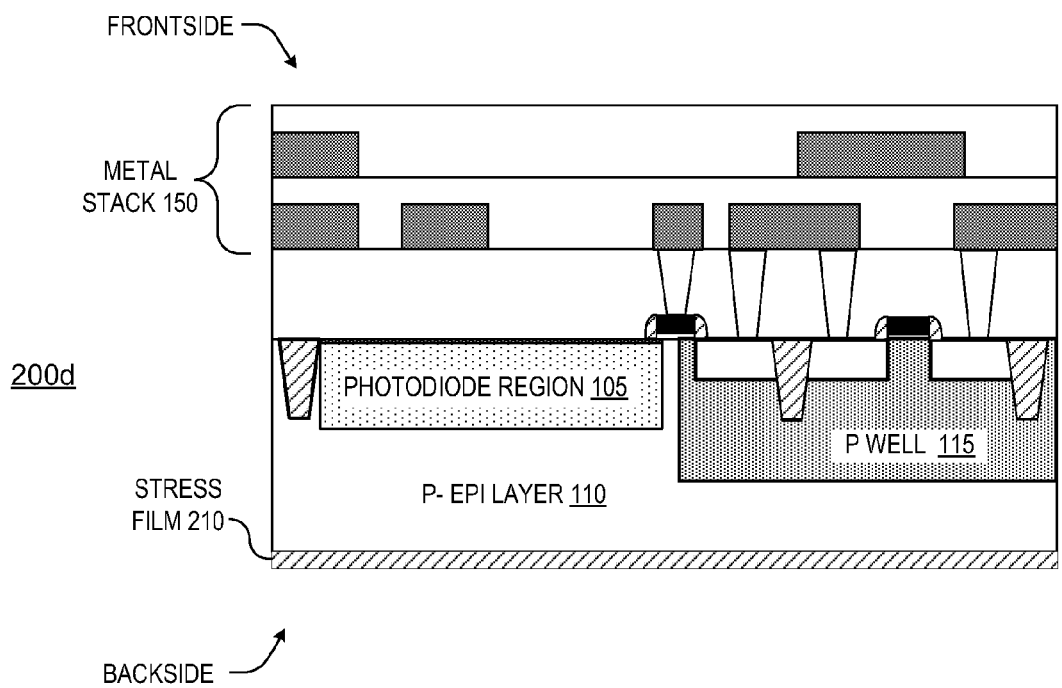
FIG. 2D is a cross sectional view of a backside illuminated image sensor including a stress film on the backside surface of the epi layer, in accordance with an embodiment.

Following the thinning, a film formation process, such as a plasma enhanced chemical vapor deposition process, may be applied to the backside surface of epi layer 110, as shown in FIG. 2C. The process forms a stress film 210 on the backside surface of the epi layer 110, as shown in FIG. 2D. For example, utilizing a PECVD process and with precursors $SiH_4$ (at a 73 standard cubic centimeters per minute, or sccm flow rate), $NH_3$ (at a 122 sccm flow rate) and $N_2$ (at a 1000 sccm flow rate), one may form a SiNx film with a 0.45 GPa compressive stress value by applying a 400 W rf chuck power at a 380 kHz frequency, and maintaining a 250 deg C. substrate temperature and a 750 mTorr gas pressure. In another example, utilizing a PECVD process and with precursors $SiH_4$ (at a 30 sccm flow rate), $NH_3$ (at a 50 sccm flow rate) and $N_2$ (at a 1960 sccm flow rate), one may form a SiNx film with a 0.36 GPa tensile stress value by applying a 17 W rf chuck power at a 13.65 MHz frequency, and maintaining a 250 deg C. substrate temperature and a 900 mTorr gas pressure. Yet in another example, one may form a $SiO_2$ film by using precursors $SiH_4$ and $O_2$, or a SiOxNy film by using precursors $SiH_4$ and $N_2O$. In other various embodiments, one of ordinary skill in the art may use materials and methods as disclosed above to form films of desirable stress characteristics. By controlling various parameters such as power level, power frequency, precursor ratio, temperature, pressure, etc., one may form tensile, compressive, or stress neutral films with desirable stress characteristics.

Figure 2E:
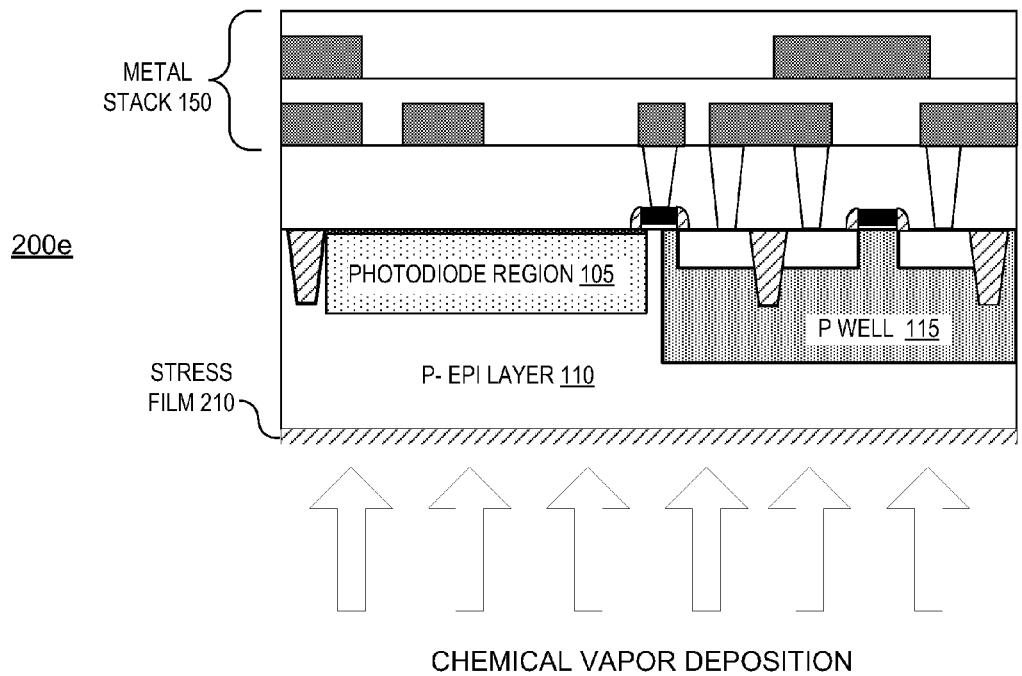
FIG. 2E is a cross sectional view of a backside illuminated image sensor showing the deposition of an additional layer of stress film on a first layer of stress film, in accordance with an embodiment.
Figure 2F:
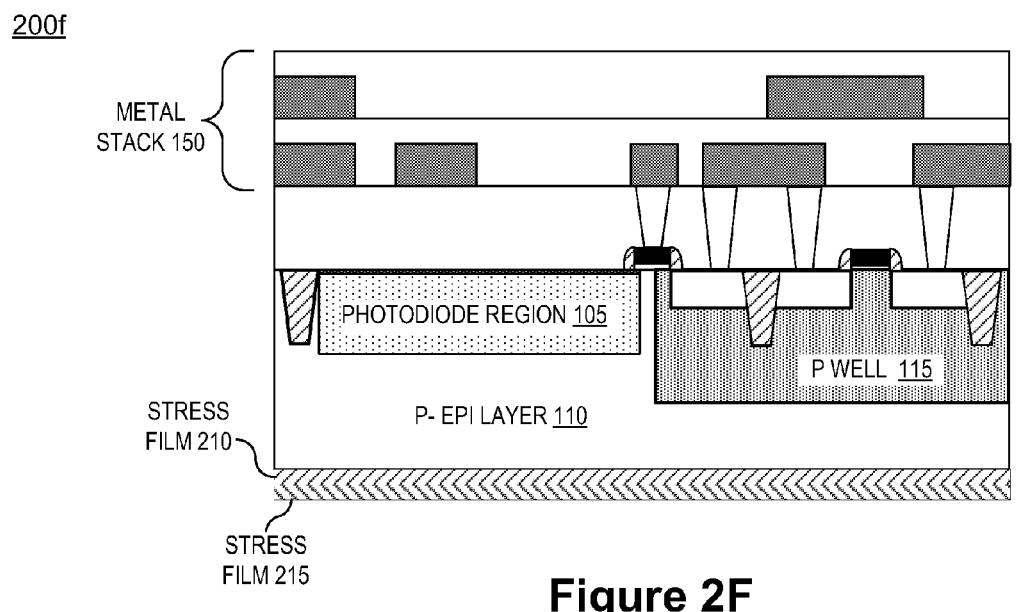
FIG. 2F is a cross sectional view of a backside illuminated image sensor including two stress films on the backside surface of the epi layer, in accordance with an embodiment.

FIG. 2E illustrates a BSI CMOS image sensor pixel 200e that includes stress film 210 on the backside surface of the epi layer 110. Pixel 200e may be subjected to one or several additional film formation processes, such as a plasma enhanced chemical vapor deposition process. The result is a pixel 200f with multiple layers of stress films 210, 215, as shown in FIG. 2F. The multiple layers of stress films may have similar or different stress characteristics. Their combination may facilitate "fine tuning" of the overall stress characteristics of the backside surface. For example, if a single layer of compressive film is not enough to produce a desirable level of compressive stress on the backside surface, then multiple layers of compressive films may be formed to produce a combined stress level that satisfies the design goal. In one embodiment, the stress films 210 and 215 may impart counteracting stresses (e.g., one tensile and the other compressive). In one embodiment, stress film 215 may be patterned and removed in selected areas, while retaining stress film 210 in those selected areas.

Figure 2G:
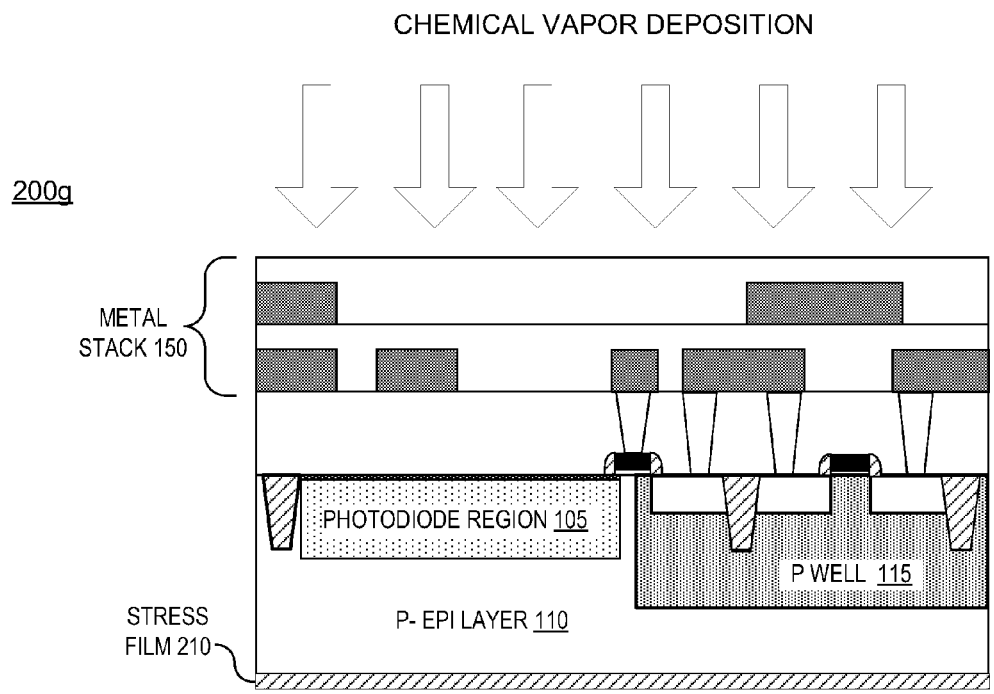
FIG. 2G is a cross sectional view of a backside illuminated image sensor showing the deposition of an additional layer of stress film on the front side of the image sensor, in accordance with an embodiment.
Figure 2H:
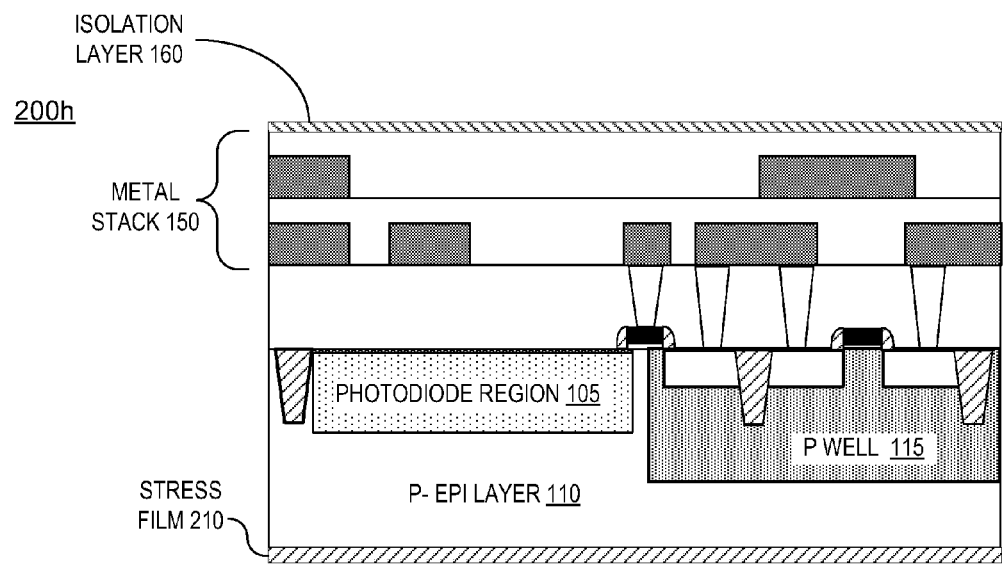
FIG. 2H is a cross sectional view of a backside illuminated image sensor including a stress film on the backside surface of the epi layer and a stress film on the front side of the imager, in accordance with an embodiment.

FIG. 2G shows a BSI CMOS image sensor pixel 200g that includes a stress film 210 on the backside surface of the epi layer 110. Pixel 200g may be subjected to one or several additional film formation processes, such as a plasma enhanced chemical vapor deposition process, at the front side of the pixel 200g. The result is a pixel 200h with one or several isolation layers 160 on top of the metal stack 150, as shown in FIG. 2H. The isolation layer 160 may be stress adjusting in nature, and may be formed with materials or methods as disclosed above. Compared with the backside stress film 210, the isolation layer 160 may have similar or different stress characteristics. The isolation layer 160 may possess stress characteristics that allow it to add or subtract stress from the front side in cooperation with the stress film 210 at the backside surface of pixel 200h. For example, the combined effect of the isolation layer 160 and the stress film 210 may allow one to "fine tune" the overall stress characteristics of pixel 200h, such as "tightening" or "loosening" the stress profile throughout pixel 200h.

Figure 3A:
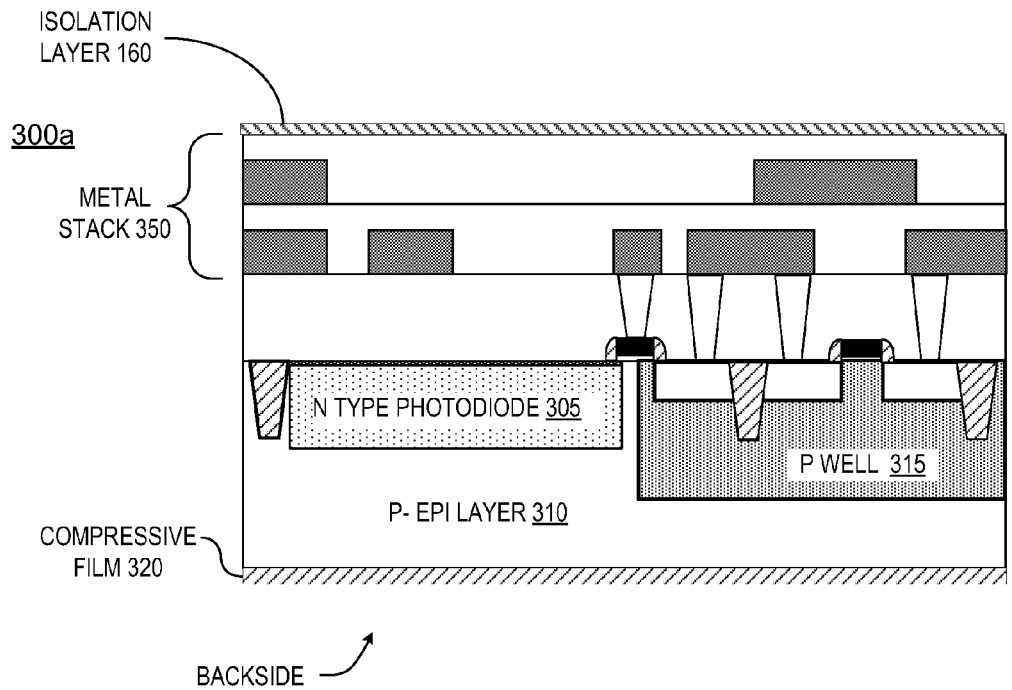
FIG. 3A is a cross sectional view of a backside illuminated image sensor with an N type photodiode and further including a compressive film, in accordance with an embodiment.

FIG. 3A shows an embodiment of a BSI CMOS image sensor pixel 300a with a compressive film 320 positioned on the pixel's backside surface. Here, pixel 300a includes an N type photodiode 305, a P type epi layer 310, and a P well 315. Upon photoelectric activation, the N type photodiode 305 collects electrons as photo generated charge carriers. The compressive film 320 may exert a compressive stress influence on the epi layer 310. This stress effect may facilitate the movement of carriers away from the backside surface by providing a substantially vertical force to push the carriers towards the collecting depletion region of the photodiode 305. Here, the compressive film 320 causes a stress effect that may simulate the effect similarly achieved by a dopant implantation process (e.g., if a P type dopant were to be implanted on the backside surface of the epi layer 310, then a similar vertical force effect might be achieved). In addition to the possibility that the compressive film 320 may produce an effect similar to that of a P type dopant implantation, the compressive film 320 may provide a number of beneficial effects. First, the absence of dopant eliminates the potential problem of the implanted dopant penetrating too deep and harming the quantum efficiency of the device. Second, the absence of dopant obviates the need for a high temperature laser annealing step. By keeping the process temperature relatively low, heat damage to the device may be substantially reduced or eliminated. However, it should be appreciated that embodiments of compressive film 320 may also be implemented in conjunction with a backside dopant implant as illustrated in FIG. 1.

Figure 3B:
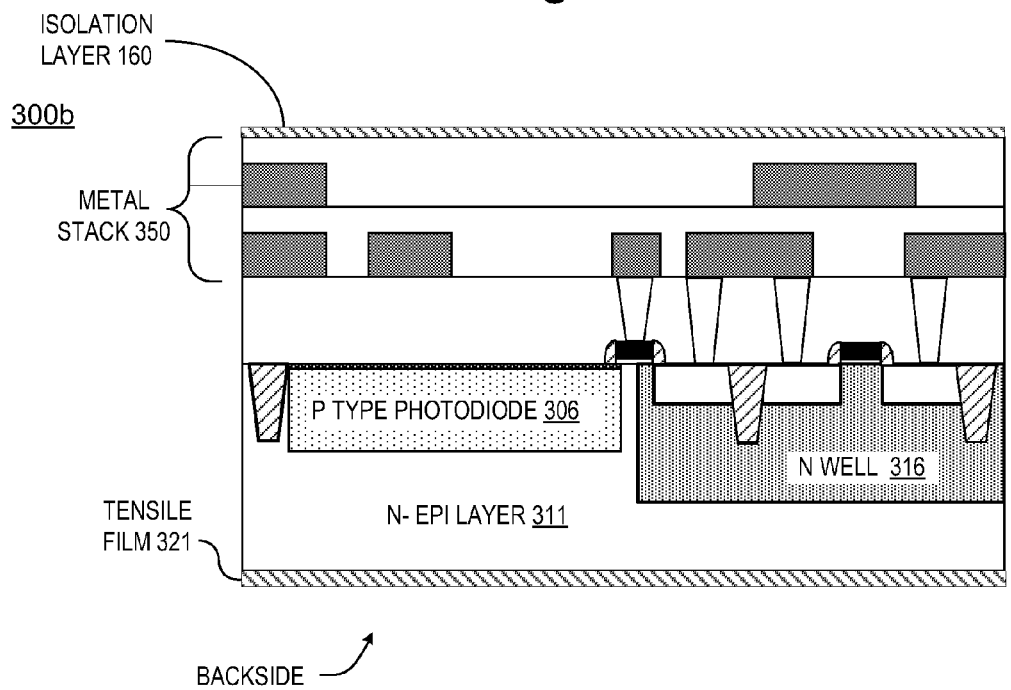
FIG. 3B is a cross sectional view of a backside illuminated image sensor with a P type photodiode and further including a tensile film, in accordance with an embodiment.

FIG. 3B shows an embodiment of a BSI CMOS image sensor pixel 300b with a tensile film 321 positioned on the pixel's backside surface. Here, pixel 300b includes a P type photodiode 306, an N type epi layer 311, and an N well 316. Upon photoelectric activation, the P type photodiode 306 produces holes as photo generated charge carriers. The tensile film 321 may exert a tensile stress influence on the epi layer 311. This stress effect may facilitate the movement of carriers away from the backside surface by providing a substantially vertical force to push the carriers towards the collecting depletion region of the photodiode 306. If an N type dopant were to be implanted on the backside surface of the epi layer 311, then a similar vertical force effect might be achieved. In addition to the possibility that the tensile film 321 may produce a similar effect as an N type dopant implantation, the tensile film 321 may provide a number of beneficial effects including the lack of harm from dopant penetration, and the avoidance of overheating, as discussed above. However, it should be appreciated that embodiments of tensile film 321 may also be implemented in conjunction with a backside dopant implant as illustrated in FIG. 1.

In certain situations, it may be desirable to increase the effect of dark currents. For example, one may utilize dark current to measure properties such as temperature. For such applications, stress films may be applied differently than the structures and methods disclosed above. For example, for an N type photodiode, a tensile film may be formed on the backside surface. In another example where a photodiode is of P type, a compressive film may be formed on the backside surface.

For certain applications, it may be desirable to employ processes in addition to the stress film formation. For example, before the stress film formation, one may apply various processes to the backside surface of the epi layer 110, such as dopant implantation, laser annealing, etc.

Typically, a BSI CMOS image sensor pixel includes one or several antireflective ("AR") coatings, such as the AR film 140 as shown in FIG. 1. An AR coating may include a layer of silicon oxide under another layer of silicon nitride or silicon oxynitride. By utilizing the above-disclosed techniques to build desirable stress characteristics into an AR coating, one may imbue such an AR coating with a stress-adjusting property in addition to an antireflection property.

Figure 4A:
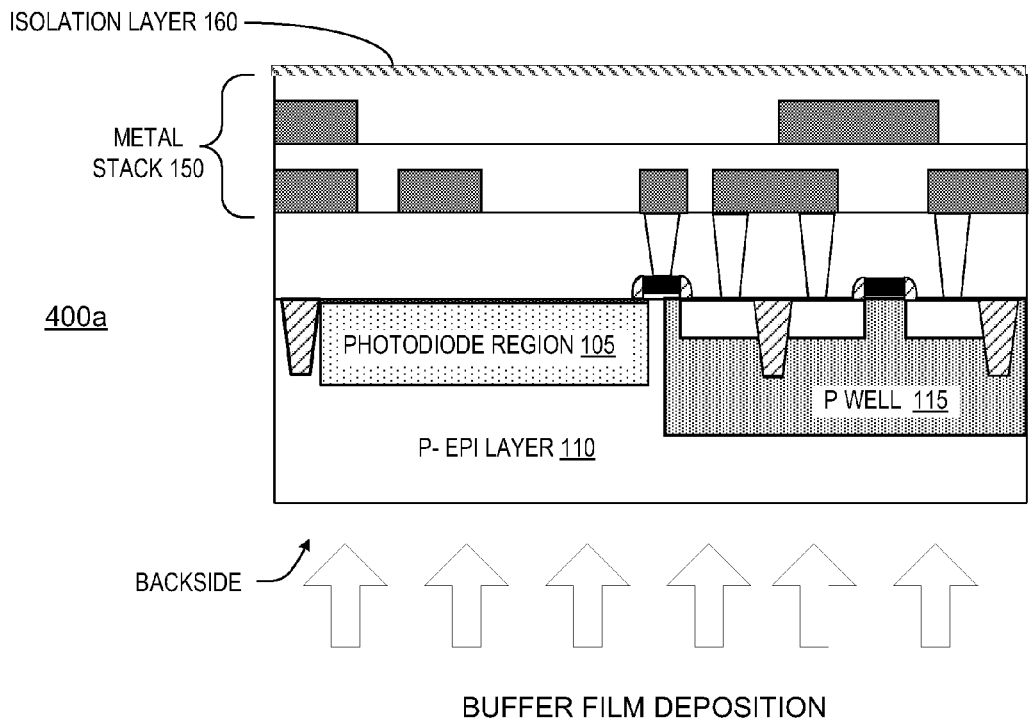
FIG. 4A is a cross sectional view of a partially fabricated backside illuminated image sensor showing the deposition of a buffer film on the backside surface of the epi layer, in accordance with an embodiment.
Figure 4B:
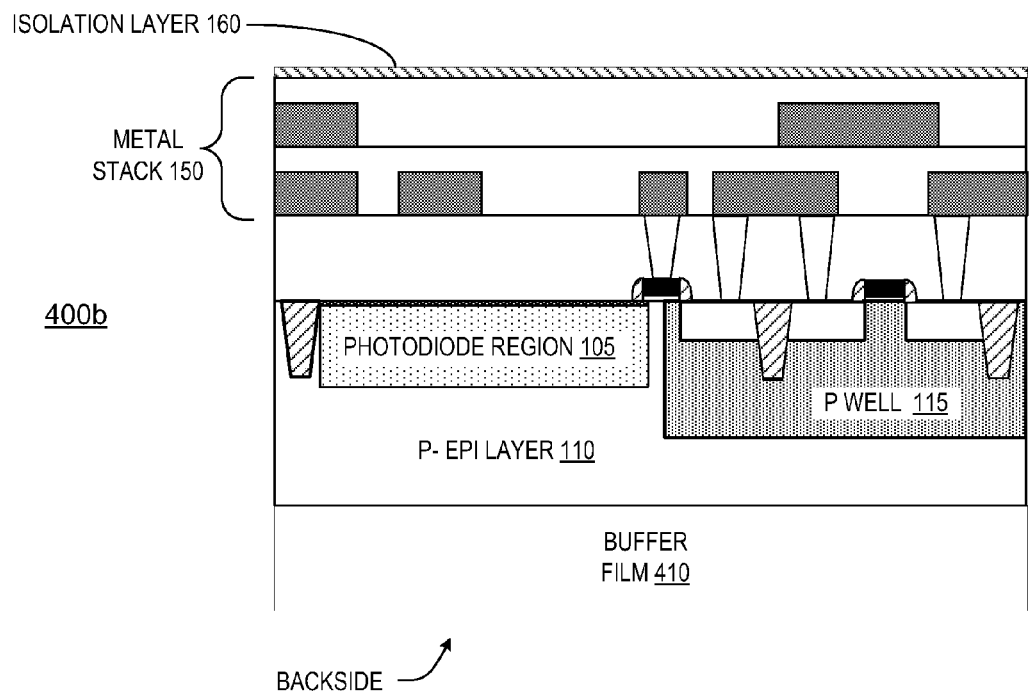
FIG. 4B is a cross sectional view of a partially fabricated backside illuminated image sensor including a buffer film on the backside surface of the epi layer, in accordance with an embodiment.

A stress film may be selectively applied to designated areas of an image sensor to achieve a desirable stress adjusting effect. For example, a stress film may be applied to a portion of a pixel or a pixel array in order to achieve a desirable stress pattern on the backside surface. The following embodiments disclose a stress pattern application using a BSI CMOS pixel as an example. FIG. 4A shows a partially fabricated BSI CMOS image sensor pixel 400a including a photodiode region 105, a P well 115, a metal stack 150, and a relatively thin backside epi layer 110. Pixel 400a may be subjected to a buffer film deposition process, as shown in FIG. 4A. The buffer film deposition may be accomplished by physical vapor deposition, chemical vapor deposition, sputtering, etc. As a result, a buffer film 410 may form on the backside surface of the epi layer 110, as shown in FIG. 4B. The buffer film 410 may be an oxide, a nitride, an oxynitride, a metal, an organic material, etc. The stress characteristic of buffer film 410 may be compressive, tensile, or neutral. In the present example embodiment, buffer film 410 is stress neutral.

Figure 4D:
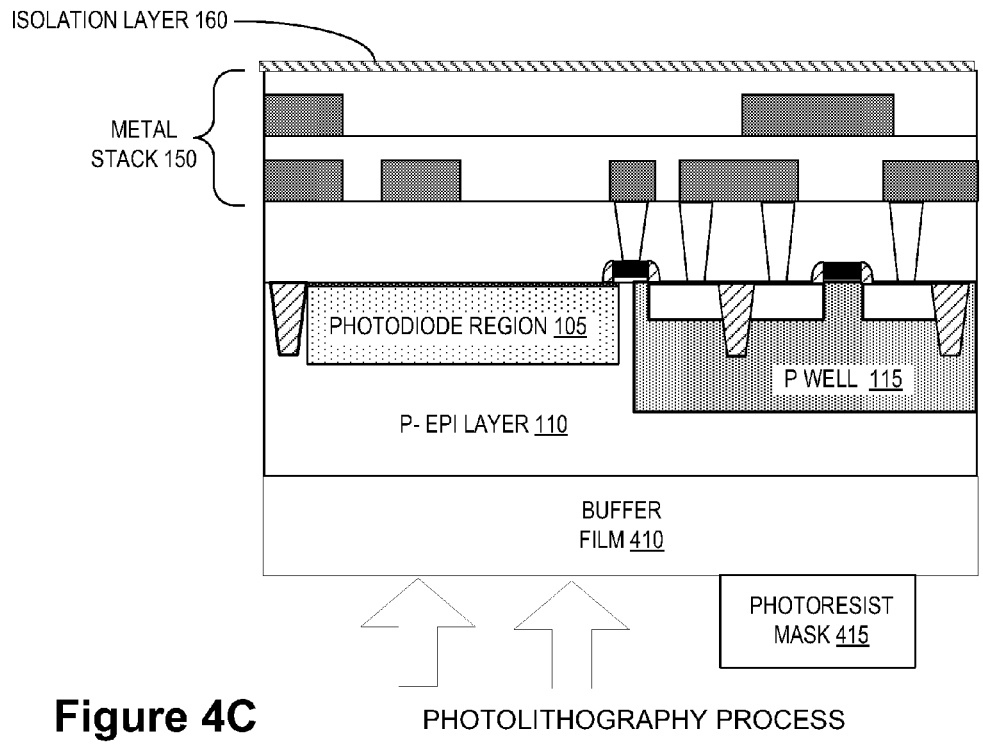
FIG. 4D is a cross sectional view of a partially fabricated backside illuminated image sensor including a buffer film that has a pattern, in accordance with an embodiment.
Figure 4D:
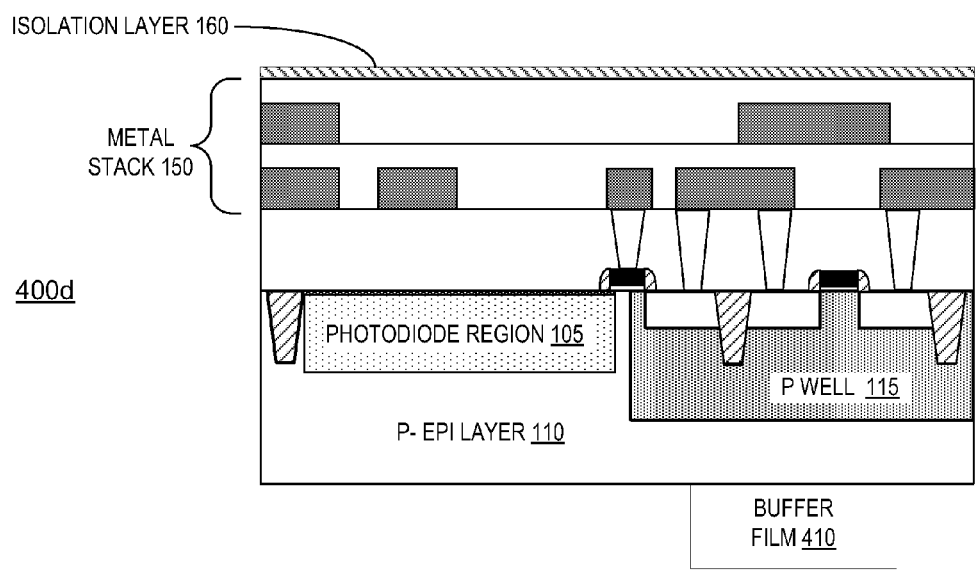
Figure 4E:
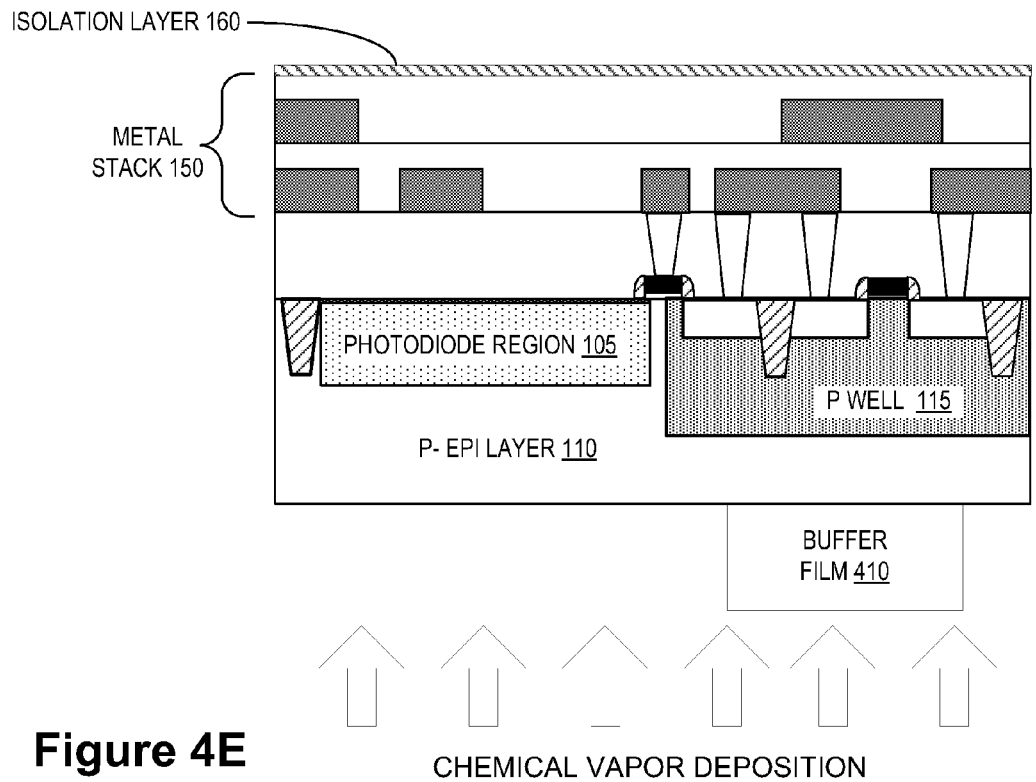
FIG. 4E is a cross sectional view of a partially fabricated backside illuminated image sensor showing the deposition of a stress film on a patterned buffer film, in accordance with an embodiment.
Figure 4F:
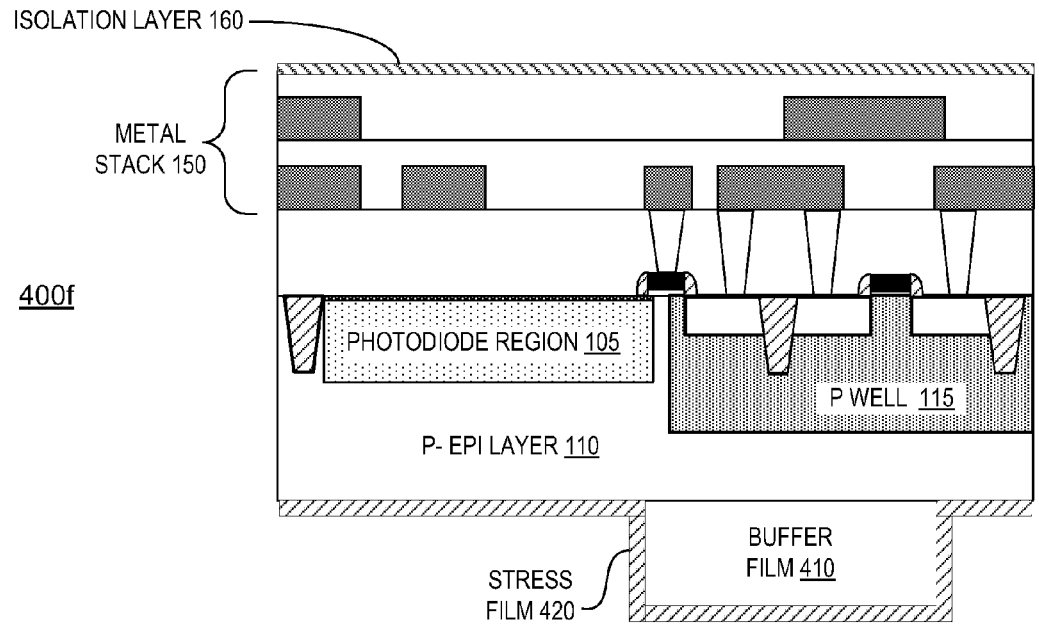
FIG. 4F is a cross sectional view of a backside illuminated image sensor including a stress film that has a pattern, in accordance with an embodiment.

Following its formation, buffer film 410 may be patterned by utilizing various processes as known in the semiconductor art. For example, buffer film 410 may be patterned by utilizing a photolithography process, as shown in FIG. 4C. The photolithography process may include steps such as application of a photoresist mask 415 that substantially covers the entire backside surface of the buffer film 410, exposure and developing, etching of the photoresist mast 415, and removal of the photoresist mask 415. The resulting pixel 400d may include a buffer film 410 that has a desirable pattern, as shown in FIG. 4D. A subsequent stress film formation process, such as a chemical vapor deposition step, may follow, as shown in FIG. 4E. A stress film 420 is formed, resulting in a pixel 400f, as shown in FIG. 4F. Pixel 400f includes a stress film 420 that covers parts of the backside of the epi layer 110, and the patterned buffer film 410. Due to the stress neutral characteristics of the buffer film 410, the stress film 420 exerts its stress adjusting effect onto the portion of the epi layer 110 that is directly exposed to the stress film 420. For the part of the pixel 400f that is "protected" by the buffer film 410, it is relatively stress free.

Figure 4G:
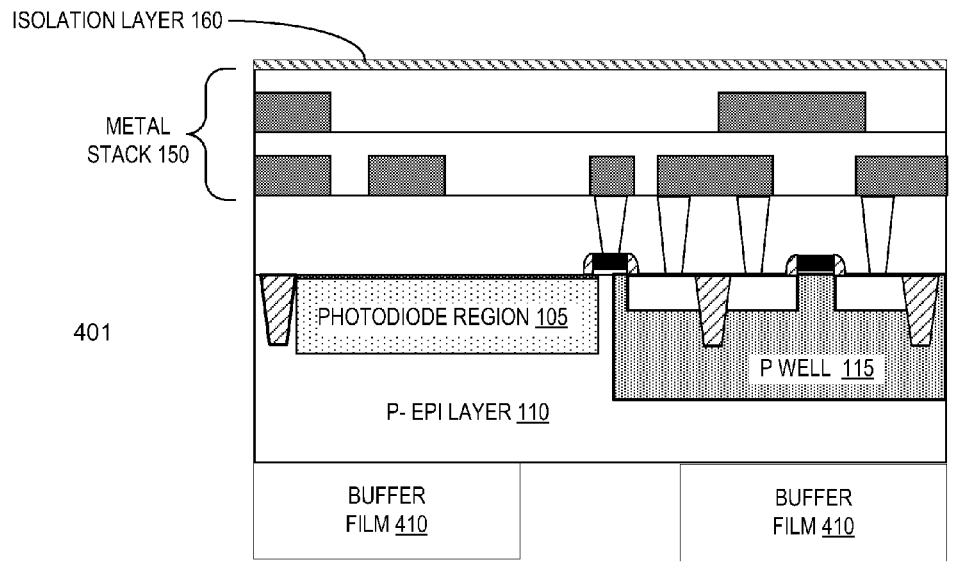
FIG. 4G is a cross sectional view of a partially fabricated image sensor including a buffer film that has an alternate pattern, in accordance with an embodiment.
Figure 4H:
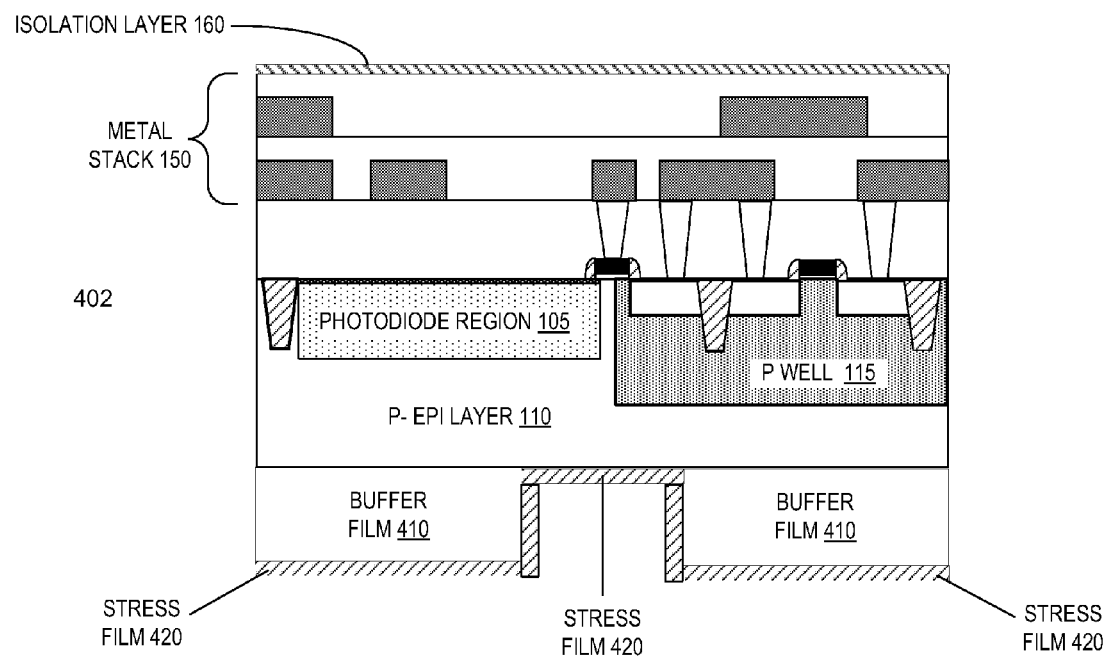
FIG. 4H is a cross sectional view of a backside illuminated image sensor including a stress film that has an alternate pattern, in accordance with an embodiment.

Depending on the particular pattern of the buffer film 410, various stress patterns may be achieved on the backside surface of a pixel. For example, the buffer film 410 may take on a different pattern (due to a different photo mask used in the photolithography process), as shown in FIG. 4G. Here, pixel 401 contains a different buffer film pattern from pixel 400d, as shown in FIG. 4D. After stress film formation, the resulting pixel 402, in FIG. 4H, has a different backside surface stress pattern from pixel 400f in FIG. 4F.

Similar to the above disclosed formation of a patterned stress film on an image sensor, a patterned isolation layer may be selectively applied to designated areas of an image sensor to achieve a desirable stress adjusting effect. For example, an isolation layer may be applied to a portion of a pixel or a pixel array in order to achieve a desirable stress pattern on the front side surface of the metal stack. The materials and methods of forming a desirable front side stress pattern may be similar to the materials and methods as disclosed above.

By varying the stress characteristics (compressive stress, tensile stress, or neutral stress at their desirable values) of the buffer film and the stress film (and/or the isolation layer), and by employing various buffer film or stress film (and/or isolation layer) patterns, one may achieve a wide variety of stress patterns on the backside surface (and/or the front side surface) of a BSI image sensor.

For example, in the case of an N type photodiode and P type epi layer 110, a compressive stress may be applied to the epi layer 110 immediately below each photodiode using a compressive film, while a buffer film may be positioned under P-well 115 or between adjacent pixels so as not to promote cross-talk between adjacent pixels. Additionally (or alternatively), a tensile film may be positioned beneath P well 115 or between adjacent pixels (e.g., the region below STI separating adjacent pixels) to attract stray charge carriers and further impede lateral crosstalk between adjacent pixels, while a compressive film is applied beneath the photodiode regions. In the case of a P type photodiode and N type epi layer 110, a tensile stress may be applied to the epi layer 311 immediately below each photodiode 306 using a tensile film, while a buffer film may be positioned under N-well 316 or between adjacent pixels so as not to promote cross-talk between adjacent pixels. Additionally (or alternatively), a compressive film may be positioned beneath N well 316 or between adjacent pixels to attract stray charge carriers and further impede lateral crosstalk between adjacent pixels, while a tensile film is applied beneath the photodiode regions. Other combination tensile/compressive patterns may be implemented.

Figure 5:
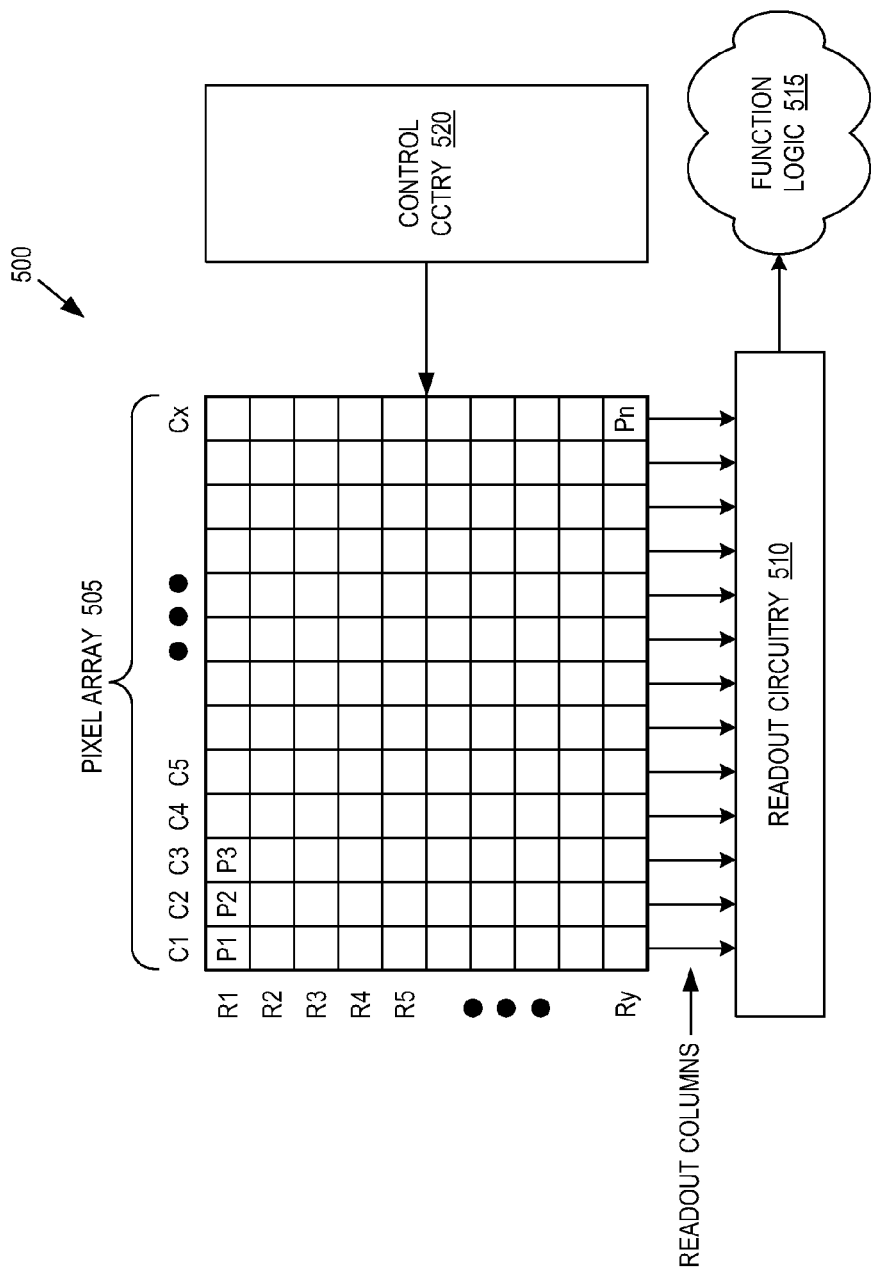
FIG. 5 is a block diagram illustrating a backside illuminated imaging system, in accordance with an embodiment of the invention.

FIG. 5 is a block diagram illustrating a BSI imaging system 500, in accordance with an embodiment of the invention. The illustrated embodiment of imaging system 500 includes a pixel array 505, readout circuitry 510, function logic 515, and control circuitry 520. The pixels of pixel array 505 may be implemented using any or all of the above described techniques including dopant layer 116 and/or the frontside and/or backside stress adjusting layers.

Pixel array 505 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 510 and transferred to function logic 515. Readout circuitry 510 may include amplification circuitry, analog-to-digital ("ADC") conversion circuitry, or otherwise. Function logic 515 may simply store the image data or even manipulate the image data by applying post image effects (e.g., crop, rotate, remove red eye, adjust brightness, adjust contrast, or otherwise). In one embodiment, readout circuitry 510 may readout a row of image data at a time along readout column lines (illustrated) or may readout the image data using a variety of other techniques (not illustrated), such as a serial readout or a full parallel readout of all pixels simultaneously.

Control circuitry 520 is coupled to pixel array 505 to control operational characteristic of pixel array 505. For example, control circuitry 520 may generate a shutter signal for controlling image acquisition. In one embodiment, the shutter signal is a global shutter signal for simultaneously enabling all pixels within pixel array 505 to simultaneously capture their respective image data during a single acquisition window. In an alternative embodiment, the shutter signal is a rolling shutter signal whereby each row, column, or group of pixels is sequentially enabled during consecutive acquisition windows.

Figure 6:
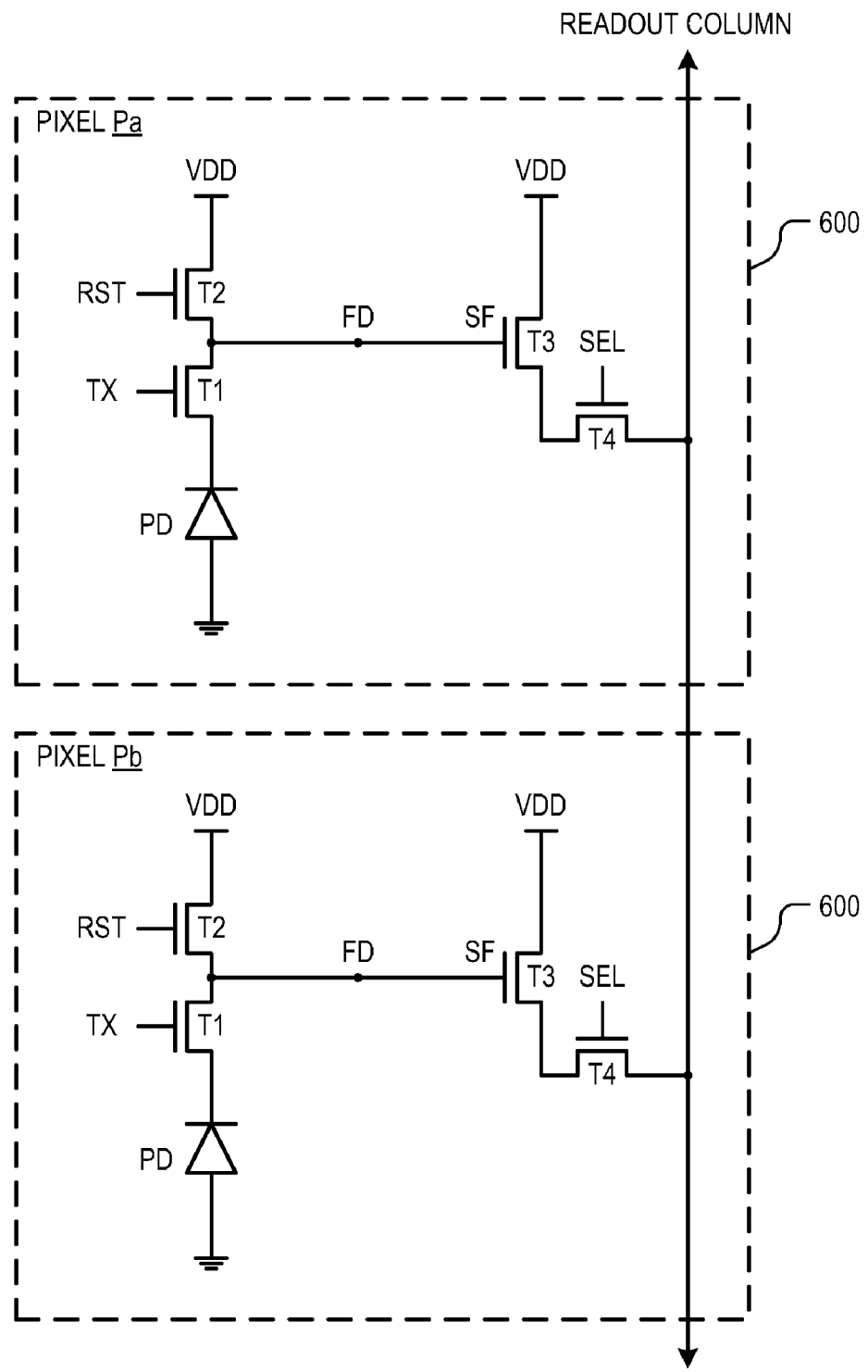
FIG. 6 is a circuit diagram illustrating pixel circuitry of two 4T pixels within a backside illuminated imaging system, in accordance with an embodiment of the invention.

FIG. 6 is a circuit diagram illustrating pixel circuitry 600 of two four-transistor ("4T") pixels within a BSI imaging array, in accordance with an embodiment of the invention. Pixel circuitry 600 is one possible pixel circuitry architecture for implementing each pixel within pixel array 500 of FIG. 5. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 6, pixels Pa and Pb are arranged in two rows and one column. The illustrated embodiment of each pixel circuitry 600 includes a photodiode PD, a transfer transistor T1, a reset transistor T2, a source-follower ("SF") transistor T3, and a select transistor T4. During operation, reset transistor T2 is coupled between a power rail VDD and the floating diffusion node FD to reset FD (e.g., charge the FD to a preset voltage) under control of a reset signal RST. During an image acquisition window, photo-generated charge carriers (e.g., electrons) accumulate within photodiode PD. Subsequently, transfer transistor T1 receives a transfer signal TX, which transfers the charge accumulated in photodiode PD to floating diffusion node FD. In one embodiment, floating diffusion node FD may be coupled to an additional storage capacitor for temporarily storing image charges.

The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 600 to the readout column line under control of a select signal SEL. In one embodiment, the TX signal, the RST signal, and the SEL signal are generated by control circuitry 520.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated ("BSI") complementary metal-oxide semiconductor ("CMOS") image sensor, comprising:
   a photosensitive region disposed within a semiconductor layer, the photosensitive region sensitive to light incident on a backside of the BSI CMOS image sensor to collect an image charge; and
   a first stress adjusting layer disposed on a backside of the semiconductor layer establishing a first stress characteristic to encourage photo-generated charge carriers to migrate towards the photosensitive region,
   wherein the first stress adjusting layer is disposed on the semiconductor layer to apply a patterned stress characteristic to the semiconductor layer such that the first stress adjusting layer applies the first stress characteristic to a first portion of the BSI CMOS image sensor on the backside of the semiconductor layer and while substantially not applying the first stress characteristic to a second portion of the BSI CMOS image sensor on the backside of the semiconductor layer.

2. The BSI CMOS image sensor of claim 1, wherein the first stress adjusting layer is disposed beneath the photosensitive region on the backside of the semiconductor layer.

3. The BSI CMOS image sensor of claim 2, wherein the photosensitive region comprises an N type photodiode region and wherein the first stress adjusting layer has a compressive stress characteristic.

4. The BSI CMOS image sensor of claim 2, wherein the photosensitive region comprises a P type photodiode region and wherein the stress adjusting layer has a tensile stress characteristic.

5. The BSI CMOS image sensor of claim 1, further comprising:
   an array of pixels each including a photosensitive region disposed within the semiconductor layer,
   wherein the first stress adjusting layer is absent below regions between adjacent pixels.

6. The BSI CMOS image sensor of claim 1, wherein the stress adjusting layer is absent below a portion of a P-well in which pixel circuitry for a pixel is disposed.

7. The BSI CMOS image sensor of claim 1, further comprising:
   a buffer layer having a substantially neutral stress characteristic disposed between the semiconductor layer and the first stress adjusting layer along the second portion of the BSI CMOS image sensor on the backside of the semiconductor layer.

8. The BSI CMOS image sensor of claim 1, further comprising:
   a second stress adjusting layer disposed on the backside of the semiconductor layer along the second portion of the BSI CMOS image sensor establishing a second stress characteristic on the semiconductor layer opposite to the first stress characteristic to inhibit upward migration of the photo-generated charge carriers along the second portion of the BSI CMOS image sensor.

9. The BSI CMOS image sensor of claim 1, further comprising:
   a second stress adjusting layer disposed on the first stress adjusting layer, wherein the first and second stress adjusting layers together impart a combined stress characteristic on the semiconductor layer.

10. The BSI CMOS image sensor of claim 1, wherein the first stress adjusting layer has an antireflective property.

11. The BSI CMOS image sensor of claim 1, further comprising:
    a metal stack disposed over a frontside of the semiconductor layer; and
    a second stress adjusting layer disposed over the metal stack to impart a second stress characteristic to the BSI CMOS image sensor from a frontside of the pixel.

12. The BSI CMOS image sensor of claim 1, wherein the first stress adjusting layer comprises a material selected from a group consisting of silicon oxide, silicon nitride and silicon oxynitride.

13. A backside illuminated ("BSI") complementary metal-oxide semiconductor ("CMOS") image sensor, comprising:
    a photosensitive region disposed within a semiconductor layer, the photosensitive region sensitive to light incident on a backside of the BSI CMOS image sensor to collect an image charge;

a first stress adjusting layer disposed on a backside of the semiconductor layer establishing a first stress characteristic to encourage photo-generated charge carriers to migrate towards the photosensitive region; and a second stress adjusting layer disposed on the first stress adjusting layer, wherein the first and second stress adjusting layers together impart a combined stress characteristic on the semiconductor layer.

14. A backside illuminated ("BSI") complementary metal-oxide semiconductor ("CMOS") image sensor, comprising:

a photosensitive region disposed within a semiconductor layer, the photosensitive region sensitive to light incident on a backside of the BSI CMOS image sensor to collect an image charge; and a first stress adjusting layer disposed on a backside of the semiconductor layer establishing a first stress characteristic to encourage photo-generated charge carriers to migrate towards the photosensitive region, wherein the first stress adjusting layer has an antireflective property.

15. A backside illuminated ("BSI") complementary metal-oxide semiconductor ("CMOS") image sensor, comprising:

a photosensitive region disposed within a semiconductor layer, the photosensitive region sensitive to light incident on a backside of the BSI CMOS image sensor to collect an image charge;

a first stress adjusting layer disposed on a backside of the semiconductor layer establishing a first stress characteristic to encourage photo-generated charge carriers to migrate towards the photosensitive region;

a metal stack disposed over a frontside of the semiconductor layer; and a second stress adjusting layer disposed over the metal stack to impart a second stress characteristic to the BSI CMOS image sensor from a frontside of the pixel.

* * * * *